US009099124B1

(12) United States Patent
Freitag et al.

(10) Patent No.: US 9,099,124 B1
(45) Date of Patent: Aug. 4, 2015

(54) TUNNELING MAGNETORESISTIVE (TMR) DEVICE WITH MGO TUNNELING BARRIER LAYER AND NITROGEN-CONTAINING LAYER FOR MINIMIZATION OF BORON DIFFUSION

(71) Applicant: HGST Netherlands B.V., Amsterdam (NL)

(72) Inventors: James Mac Freitag, Sunnyvale, CA (US); Zheng Gao, San Jose, CA (US)

(73) Assignee: HGST Netherlands B.V., Amsterdam (NL)

( * ) Notice: Subject to any disclaimer, the term of this patent is extended or adjusted under 35 U.S.C. 154(b) by 0 days.

(21) Appl. No.: 14/499,218

(22) Filed: Sep. 28, 2014

(51) Int. Cl.
*G11B 5/39* (2006.01)

(52) U.S. Cl.
CPC ............... *G11B 5/3909* (2013.01); *G11B 5/39* (2013.01)

(58) Field of Classification Search
CPC ............ G11B 5/33; G11B 5/332; G11B 5/39; G11B 5/3903; G11B 5/3906; G11B 5/3909; G11B 5/3929
USPC .................. 360/324.1, 324.11, 324.12, 324.2
See application file for complete search history.

(56) References Cited

U.S. PATENT DOCUMENTS

| 8,059,374 | B2 * | 11/2011 | Zhao et al. ................. 360/324.2 |
| 8,225,489 | B2 * | 7/2012 | Miyauchi et al. .......... 29/603.16 |
| 8,514,527 | B2 * | 8/2013 | Komagaki et al. ....... 360/324.11 |
| 8,907,436 | B2 * | 12/2014 | Oh et al. ....................... 257/421 |
| 2008/0112093 | A1 * | 5/2008 | Sato et al. .................. 360/324.2 |
| 2012/0299132 | A1 | 11/2012 | Lin |

* cited by examiner

*Primary Examiner* — Jefferson Evans
(74) *Attorney, Agent, or Firm* — Thomas R. Berthold

(57) ABSTRACT

A tunneling magnetoresistance (TMR) device, like a magnetic recording disk drive read head, has a nitrogen-containing layer between the MgO barrier layer and the free and/or reference ferromagnetic layers that contain boron. In one embodiment the free ferromagnetic layer includes a boron-containing layer and a trilayer nanolayer structure between the MgO barrier layer and the boron-containing layer. The trilayer nanolayer structure includes a thin Co, Fe or CoFe first nanolayer in contact with the MgO layer, a thin FeN or CoFeN second nanolayer on the first nanolayer and a thin Co, Fe or CoFe third nanolayer on the FeN or CoFeN nanolayer between the FeN or CoFeN nanolayer and the boron-containing layer. If the reference ferromagnetic layer also includes a boron-containing layer then a similar trilayer nanolayer structure may be located between the boron-containing layer and the MgO barrier layer.

17 Claims, 4 Drawing Sheets

TUNNELING MAGNETORESISTIVE (TMR) DEVICE WITH MGO TUNNELING BARRIER LAYER AND NITROGEN-CONTAINING LAYER FOR MINIMIZATION OF BORON DIFFUSION

BACKGROUND OF THE INVENTION

1. Field of the Invention

The invention relates generally to tunneling magnetoresistance (TMR) devices, and more particularly to a TMR read head with a magnesium oxide (MgO) tunneling barrier layer and a boron-containing ferromagnetic layer.

2. Description of the Related Art

A tunneling magnetoresistance (TMR) device, also called a magnetic tunneling junction (MTJ) device, is comprised of two ferromagnetic layers separated by a thin insulating tunneling barrier layer. The barrier layer is typically made of a metallic oxide that is so sufficiently thin that quantum-mechanical tunneling of charge carriers occurs between the two ferromagnetic layers. While various metallic oxides, such as alumina ($Al_2O_3$) and titanium oxide ($TiO_2$), have been proposed as the tunneling barrier material, the most promising material is crystalline magnesium oxide (MgO). The quantum-mechanical tunneling process is electron spin dependent, which means that an electrical resistance measured when applying a sense current across the junction depends on the spin-dependent electronic properties of the ferromagnetic and barrier layers, and is a function of the relative orientation of the magnetizations of the two ferromagnetic layers. The magnetization of one of the ferromagnetic layers, called the reference layer, is fixed or pinned, while the magnetization of the other ferromagnetic layer, called the free layer, is free to rotate in response to external magnetic fields. The relative orientation of their magnetizations varies with the external magnetic field, thus resulting in change in the electrical resistance. The TMR device is usable as a memory cell in a nonvolatile magnetic random access memory (MRAM) array and as TMR read head in a magnetic recording disk drive.

FIG. 1 illustrates a cross-sectional view of a conventional TMR read head 10. The TMR read head 10 includes a bottom "fixed" or "pinned" reference ferromagnetic (FM) layer 18, an insulating tunneling barrier layer 20, and a top "free" FM layer 32. The TMR read head 10 has bottom and top nonmagnetic electrodes or leads 12, 14, respectively, with the bottom nonmagnetic electrode 12 being formed on a suitable substrate. The FM layer 18 is called the reference layer because its magnetization is prevented from rotation in the presence of an applied magnetic field in the desired range of interest for the TMR device, i.e., the magnetic field from a recorded region of the magnetic layer in a magnetic recording disk. The magnetization of the reference FM layer 18 can be fixed or pinned by being formed of a high-coercivity film or by being exchange-coupled to an antiferromagnetic (AF) "pinning" layer. The reference FM layer 18 may be part of an antiparallel (AP) pinned or flux-closure structure, where two ferromagnetic layers are separated by an antiparallel coupling (APC) spacer layer and thus antiparallel-coupled to form a flux closure, as described in U.S. Pat. No. 5,465,185. The magnetization of the free FM layer 32 is free to rotate in the presence of the applied magnetic field in the range of interest. In the absence of the applied magnetic field, the magnetizations of the FM layers 18 and 32 are aligned generally perpendicular in the TMR read head 10. The relative orientation of the magnetizations of the FM layers 18, 32 determines the electrical resistance of the TMR device.

It is known that TMR devices with MgO tunneling barriers, specifically Fe/MgO/Fe, CoFe/MgO/CoFe, and Co/MgO/Co tunnel junctions, exhibit a very large magnetoresistance due to coherent tunneling of the electrons of certain symmetry. However, MgO tunnel junctions are required to have (001) epitaxy and perfect crystallinity. The MgO barrier layer is typically formed by sputter deposition and subsequent annealing, which forms the crystalline structure. For CoFe/MgO/CoFe tunnel junctions it is known that magnetoresistance is low due to inferior crystallinity of the MgO barrier layer. However, it has been found that when boron (B) is used in one or more of the reference and free ferromagnetic layers, such as by the use of a thin amorphous CoFeB or CoFeBTa layer in a multilayer structure, higher tunneling magnetoresistance ($\Delta R/R$ or TMR) is observed after annealing. The amorphous CoFeB layer is known to promote high-quality crystallization of the MgO into the (001) direction, and thus higher TMR.

Advanced TMR devices with even higher TMR will require a reduction in the resistance-area product (RA), which means that the MgO barrier layers will need to be made thinner. However, as the MgO thickness decreases the TMR also decreases, which is believed due, in part, to diffusion of boron into the MgO barrier layer. The reduction in MgO thickness also results in an undesirable increase in interlayer coupling field ($H_{int}$), i.e., the strength of the magnetic coupling field between the reference layer and the free layer. A large $H_{int}$ degrades the performance of the TMR read head. It is important to have low values of $H_{int}$ as the MgO barrier layer thickness is reduced.

What is needed is a TMR device with a thin MgO barrier layer and thus reduced RA, but with high TMR and low $H_{int}$.

SUMMARY OF THE INVENTION

Embodiments of this invention relate to a TMR device with a thin MgO barrier layer and a nitrogen-containing layer between the MgO barrier layer and the free and/or reference boron-containing ferromagnetic layers. In one embodiment the free ferromagnetic layer includes a boron-containing layer and a trilayer nanolayer structure between the MgO barrier layer and the boron-containing layer. The trilayer nanolayer structure includes a thin Co, Fe or CoFe first nanolayer in contact with the MgO layer, a thin FeN or CoFeN second nanolayer on the first nanolayer and a thin Co, Fe or CoFe third nanolayer on the FeN or CoFeN nanolayer between the FeN or CoFeN nanolayer and the boron-containing layer. If the reference ferromagnetic layer also includes a boron-containing layer then a similar trilayer nanolayer structure may be located between the boron-containing layer and the MgO barrier layer. TMR devices according to embodiments of the invention exhibit greater values of TMR and lower values of interlayer coupling field ($H_{int}$) for thin MgO barrier layers than TMR devices without the nitrogen-containing layers.

For a fuller understanding of the nature and advantages of the present invention, reference should be made to the following detailed description taken together with the accompanying figures.

DETAILED DESCRIPTION OF THE INVENTION

Figure 1:
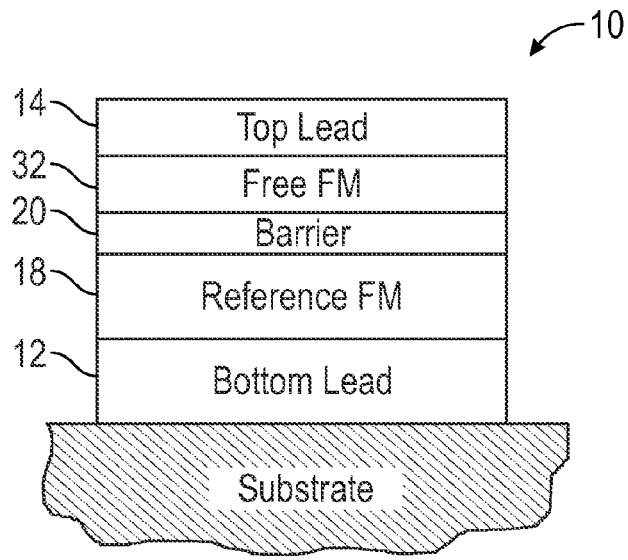
FIG. 1 is a cross-sectional view illustrating the structure of a conventional tunneling magnetoresistive (TMR) read head.
Figure 2:
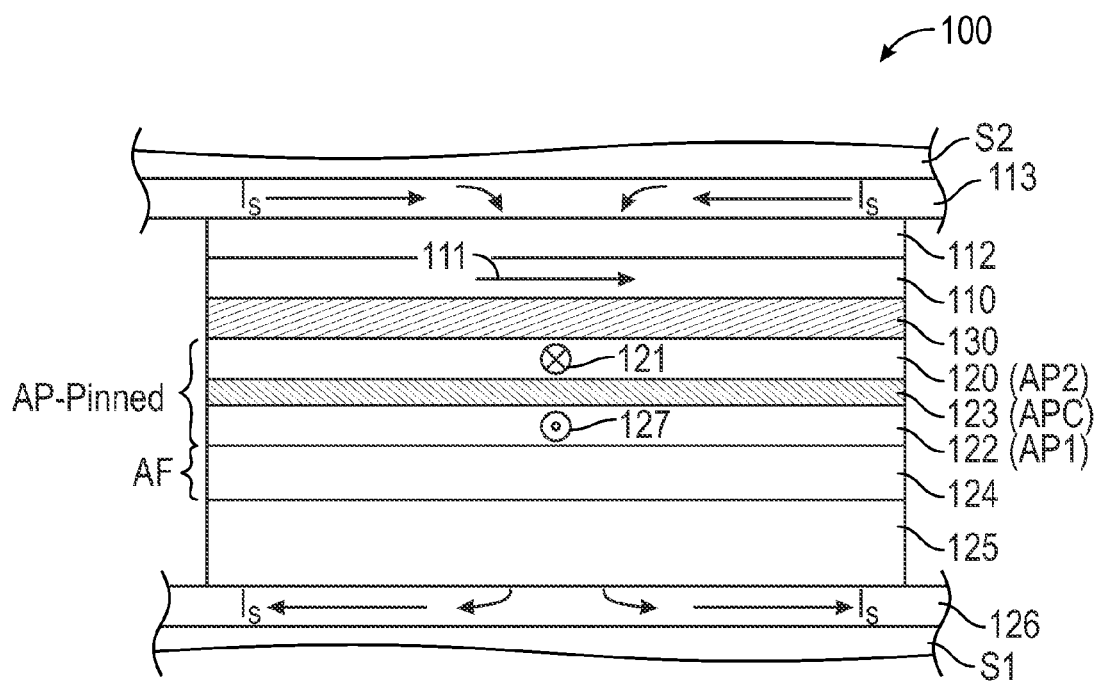
FIG. 2 is a cross-sectional view illustrating the detailed structure of a prior-art TMR read head.

FIG. 2 is a cross-sectional highly schematic view illustrating the structure of a prior-art TMR read head 100 like that used in a magnetic recording disk drive. This cross-sectional view is a view of what is commonly referred to as the air-bearing surface (ABS) of the TMR read head 100. The TMR read head 100 includes a sensor stack of layers formed between two ferromagnetic shield layers S1, S2 that are typically made of electroplated NiFe alloy films. The lower shield S1 is typically smoothened by chemical-mechanical polishing (CMP) to provide a smooth surface for the growth of the sensor stack. The sensor stack includes a ferromagnetic reference layer 120 having a pinned magnetization 121 oriented transversely (away from the page), a ferromagnetic free layer 110 having a magnetization 111 that can rotate in the plane of layer 110 in response to transverse external magnetic fields from a recording disk, and an electrically insulating tunneling barrier layer 130, typically magnesium oxide (MgO), between the ferromagnetic reference layer 120 and ferromagnetic free layer 110.

The reference layer 120 may be a conventional "simple" or single pinned layer that has its magnetization direction 121 pinned or fixed, typically by being exchange coupled to an antiferromagnetic layer. However, in the example of FIG. 2, the reference layer 120 is part of the well-known antiparallel (AP) pinned or flux-closure structure, also called a "laminated" pinned layer, as described in U.S. Pat. No. 5,465,185. The AP-pinned structure minimizes magnetostatic coupling of the reference layer 120 with the free layer 110. The AP-pinned structure includes the reference ferromagnetic (AP2) layer 120 and a lower pinned ferromagnetic (AP1) layer 122 that are antiferromagnetically coupled across an AP coupling (APC) layer 123, such as Ru, Ir, Rh, or Cr, or alloys thereof. Due to the antiparallel coupling across the APC layer 123, the reference (AP2) and pinned (AP1) ferromagnetic layers 120, 122 have their respective magnetizations 121, 127 oriented antiparallel to each other. As a result, the net magnetization of the AP2 and AP1 ferromagnetic layers 120, 122 is so small that a demagnetizing field induced by the flux closure structure in the ferromagnetic free layer 110 is substantially minimized, and thus it becomes feasible for the TMR read head to operate optimally.

Located between the lower shield layer S1 and the AP-pinned structure are seed layer 125 and an antiferromagnetic (AF) pinning layer 124. The seed layer 125 facilitates the AF pinning layer 124 to grow a microstructure with a strong crystalline texture and thus develop strong antiferromagnetism. The seed layer 125 may be a single layer or multiple layers of different materials. The AF pinning layer 124 thus strongly exchange-couples to the ferromagnetic pinned layer 122, and thereby rigidly pins the magnetization 127 of the ferromagnetic pinned layer 122 in a direction perpendicular to and away from the ABS. The antiparallel coupling across the APC layer 123 then subsequently rigidly pins the magnetization 121 of the ferromagnetic reference layer 120 in a direction perpendicular to and towards the ABS, and antiparallel to magnetization 127. As a result, the net magnetization of the ferromagnetic AP2 and AP1 layers 120, 122 is rigidly pinned, and thus the optimal operation of the TMR read head is ensured. Instead of being pinned by an AF layer, the AP1 layer 122 may by itself be a hard magnetic layer or have its magnetization 127 pinned by a hard magnetic layer such as $Co_{100-x}Pt_x$ or $Co_{100-x-y}Pt_xCr_y$ (where x is between about and 8 and 30 atomic percent). The AP-pinned structure may also be "self-pinned". In a "self pinned" sensor the AP1 and AP2 layer magnetization directions 127, 121 are typically set generally perpendicular to the disk surface by magnetostriction and the residual stress that exists within the fabricated sensor.

Located between the ferromagnetic free layer 110 and the upper shield layer S2 is a layer 112, sometimes called a capping or cap layer. The layer 112 protects the ferromagnetic free layer 110 from chemical and mechanical damages during processing, so that ferromagnetic free layer 110 maintains good ferromagnetic properties.

In the presence of external magnetic fields in the range of interest, i.e., magnetic fields from written data on the recording disk, while the net magnetization of the ferromagnetic layers 120, 122 remains rigidly pinned, the magnetization 111 of the ferromagnetic free layer 110 will rotate in responses to the magnetic fields. Thus when a sense current $I_S$ flows from the upper shield layer S2 perpendicularly through the sensor stack to the lower shield layer S1, the magnetization rotation of the ferromagnetic free layer 111 will lead to the variation of the angle between the magnetizations of the ferromagnetic reference layer 120 and the ferromagnetic free layer 110, which is detectable as the change in electrical resistance. Because the sense current is directed perpendicularly through the stack of layers between the two shields S1 and S2, the TMR read head 100 is a current-perpendicular-to-the-plane (CPP) read head.

FIG. 2 also shows optional separate electrical leads 126, 113 between shields S1, S2, respectively, and the sensor stack. Leads 126, 113 may be formed of Ta, Ti, Ru, Rh or a multilayer thereof. The leads are optional and may be used to adjust the shield-to-shield spacing. If the leads 126 and 113 are not present, the bottom and top shields S1 and S2 are used as electrical leads. The ferromagnetic reference and free layers 120 and 110 are typically formed of a CoFe, CoFeB or NiFe layer, or formed of multiple layers comprising these films, while the ferromagnetic pinned layer 122 is typically formed of CoFe alloys. The seed layer 125 is typically formed of multiple layers comprising Ta/NiFeCr/NiFe, Ta/NiFe, Ta/Ru or Ta/Cu films. The AFM pinning layer 124 is typically made of an FeMn, NiMn, PtMn, IrMn, PdMn, PtPdMn or RhMn film. The cap layer 112 is typically made of Ru, Rh, Ti, Ta or a multilayer thereof.

While the TMR read head 100 shown in FIG. 2 is a "bottom-pinned" read head because the AP-pinned structure is below the free layer 110, the free layer 110 can be located below the AP-pinned structure. In such an arrangement the layers of the AP-pinned structure are reversed, with the AP2 layer 120 on top of and in contact with the barrier layer 130.

Figure 3:
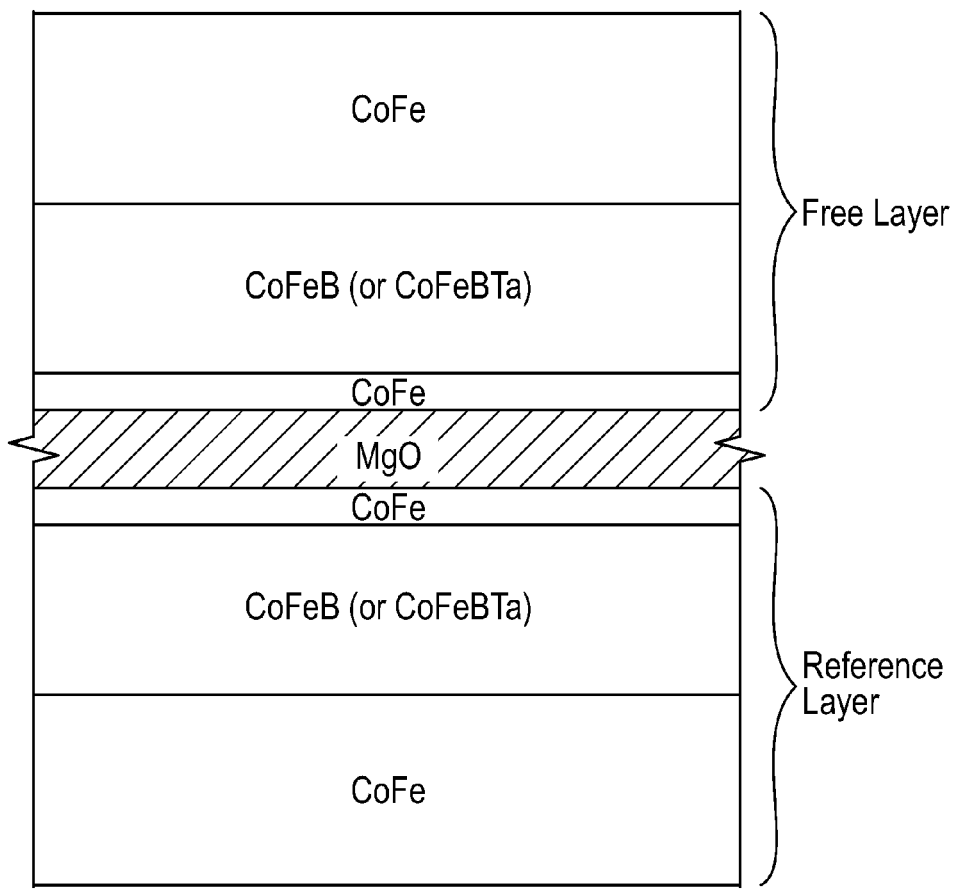
FIG. 3 is a schematic illustrating a typical reference-layer/MgO/free-layer structure with boron present in the reference and free layers in a prior art TMR read head.

MgO tunnel junctions are required to have (001) epitaxy and perfect crystallinity. The MgO barrier layer is typically formed by sputter deposition and subsequent annealing, which forms the crystalline structure. It has been found that the use of a thin amorphous CoFeB or CoFeBTa layer in one or both of the reference and free layer results in higher tunneling magnetoresistance (ΔR/R or TMR). The as-deposited amorphous CoFeB layer is known to promote high-quality crystallization of the MgO into the (001) direction, and thus higher TMR after annealing. Thus FIG. 3 is a schematic illustrating a typical reference-layer/MgO/free-layer structure with boron present in the reference and free layers. Each of the reference and free ferromagnetic layers is depicted as a thin (e.g., between about 1-4 Å thick) CoFe "nanolayer" adjacent the MgO barrier layer, a CoFe layer and a CoFeB (and in some instances CoHf, CoFeBTa, or other amorphous insertion layer) layer between the nanolayer and the CoFe layer. The CoFeB layer has a typical composition of $(Co_x Fe_{(100-x)})_{(100-y)}B_y$, where the subscripts represent atomic percent, x is between about 60 and 100, and y is between about 10 and 20. The total thickness of each of the reference and free layers is typically between about 20 and 80 Å. Other materials are well known for use in the reference and free layers, such as Co or Fe nanolayers, NiFe alloys and Heusler alloys.

Advanced TMR devices with even higher TMR will require a reduction in the resistance-area product (RA), which means that the MgO barrier layers will need to be made thinner. However, as the MgO thickness decreases the TMR also decreases, which is believed, in part, due to diffusion of boron into the MgO barrier layer. The reduction in MgO thickness also results in an undesirable increase in interlayer coupling field ($H_{int}$), i.e., the strength of the magnetic coupling field between the reference layer and the free layer.

Figure 4:
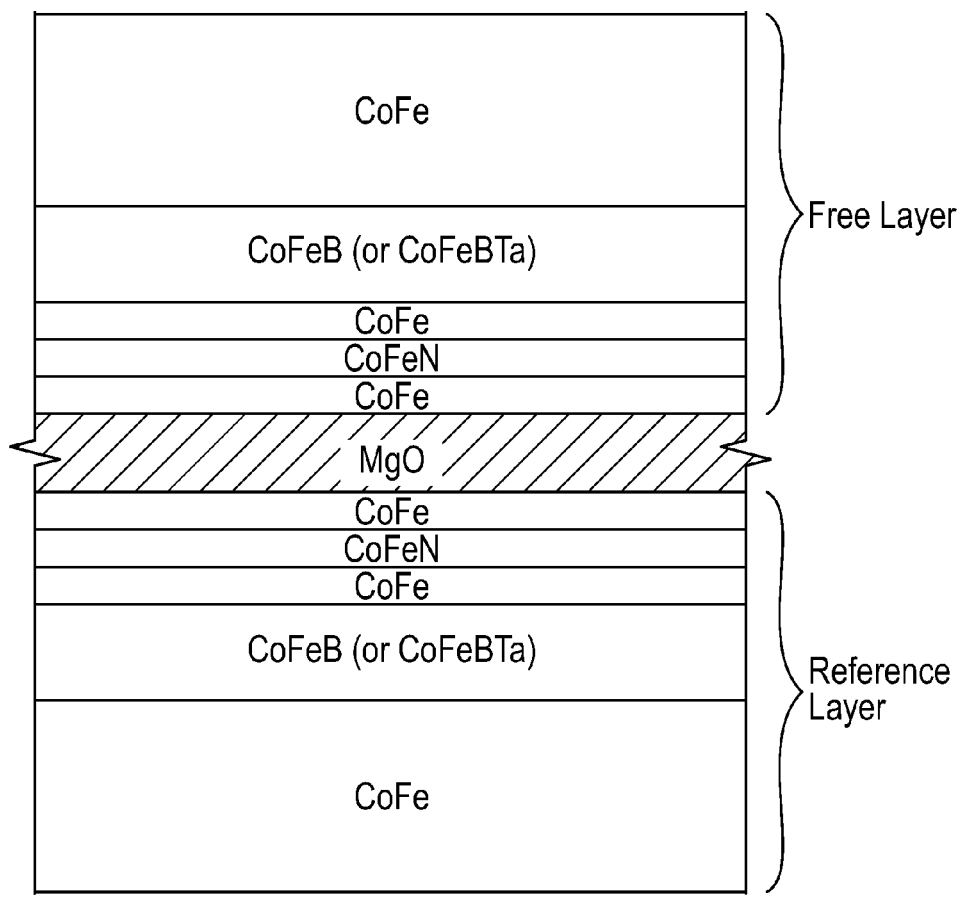
FIG. 4 is a schematic illustrating a reference-layer/MgO/free-layer structure with boron present in the reference and free layers and with a nitrogen-containing layer between the MgO barrier layer and the boron-containing layer according to an embodiment of the invention.

Embodiments of this invention relate to a TMR device with a thin MgO barrier layer and a nitrogen-containing layer between the MgO barrier layer and the free and/or reference boron-containing layers that has been shown to reduce diffusion of the boron into the MgO barrier layer. FIG. 4 is a schematic illustrating a reference-layer/MgO/free-layer structure with boron present in the reference and free layers according to an embodiment of the invention. The MgO barrier layer has a typical thickness in the range of about 6 to 10 Å. Each of the reference and free layers contains boron in the form of a CoFeB (or CoFeBTa) layer and a thin (e.g., between about 1-4 Å thick) nitrogen-containing nanolayer between the MgO barrier layer and the boron-containing layer. In the preferred embodiment the nitrogen-containing nanolayer is a CoFeN nanolayer that is part of a trilayer nanolayer structure that includes a thin (e.g., between about 1-4 Å thick) CoFe nanolayer in contact with the MgO layer and another thin (e.g., between about 1-4 Å thick) CoFe nanolayer between the CoFeN nanolayer and the CoFeB (or CoFeBTa) layer. The CoFe nanolayers preferably have a composition of the form $Co_xFe_{(100-x)}$ where x is between about 20 and 80 atomic percent. In another embodiment the CoFe nanolayers may be replaced by Co or Fe nanolayers and the CoFeN nanolayers replaced by FeN nanolayers. The combined thickness of the trilayer nanolayer structure is greater than or equal to 3 Å and less than or equal to 12 Å. FIG. 4 depicts both the reference and free layers as containing boron; however the TMR device according to embodiments of the invention may have only the free layer or only the reference layer as containing boron, in which case only that layer will have the nitrogen-containing layer located between the MgO barrier layer and the boron-containing layer. FIG. 4 also depicts the TMR device as a "bottom-pinned" device because the reference layer is below the free layer; however, the reference layer may be located above the free layer, in the manner as described above in FIG. 2.

The TMR read head with the tunnel junction described above and shown in FIG. 4 is fabricated in the conventional manner by deposition of the layers in the sensor stack by sputter deposition or other known thin-film disposition techniques. The CoFeN (or FeN) nanolayers may be deposited by reactive sputtering from a CoFe (or Fe) target, or co-sputtered from separate Co and Fe targets, in the presence of nitrogen gas. The nitrogen concentration in the reactive sputtering gas should preferably be between 5% and 50%, which results in an estimated composition being of the form $(Co_x Fe_{(100-x)})_{(100-y)}N_y$, (or $Fe_{(100-y)}N_y$), where x is between about 20 and 80 atomic percent and y is between about 1 and 50 atomic percent. Structural analysis of the as-deposited films suggests a nitrogen-doped phase with minor ordered phases appearing as the reactive nitrogen flow increases. The structure is then annealed in the presence of an applied magnetic field to set the direction of the magnetization of the reference ferromagnetic layer. The annealing is typically done at about 250 to 290° C. for about 4 to 24 hours. The annealing also forms the MgO barrier layer with the desired crystallinity, but without significant diffusion of the boron into the MgO barrier layer. In addition, some of the nitrogen in the CoFeN layer can diffuse out of this layer into other surrounding layers, including the barrier layer, during the annealing. After deposition and annealing of the films, the stack is lithographically patterned and etched to define the desired dimensions for the read head.

TMR test devices according to an embodiment of the invention were fabricated at the wafer level and compared with TMR control devices for TMR (ΔR/R) and $H_{int}$. For both the test and control devices the MgO barrier layer was formed on a Co nanolayer. The primary portion of the free layer was a 15 Å thick $(Co_{96}Fe_4)B_{20}$ layer. For the control devices the structure between the MgO layer and the primary free layer portion was a 5 Å $Co_{40}Fe_{60}$ bilayer nanolayer structure without nitrogen. For the test devices the structure between the MgO layer and the primary free layer portion was a 2 Å $Co_{50}Fe_{50}$/2 Å CoFeN/2 Å $Co_{50}Fe_{50}$ trilayer nanolayer structure. Test and control devices were fabricated with different values of RA.

Figure 5:
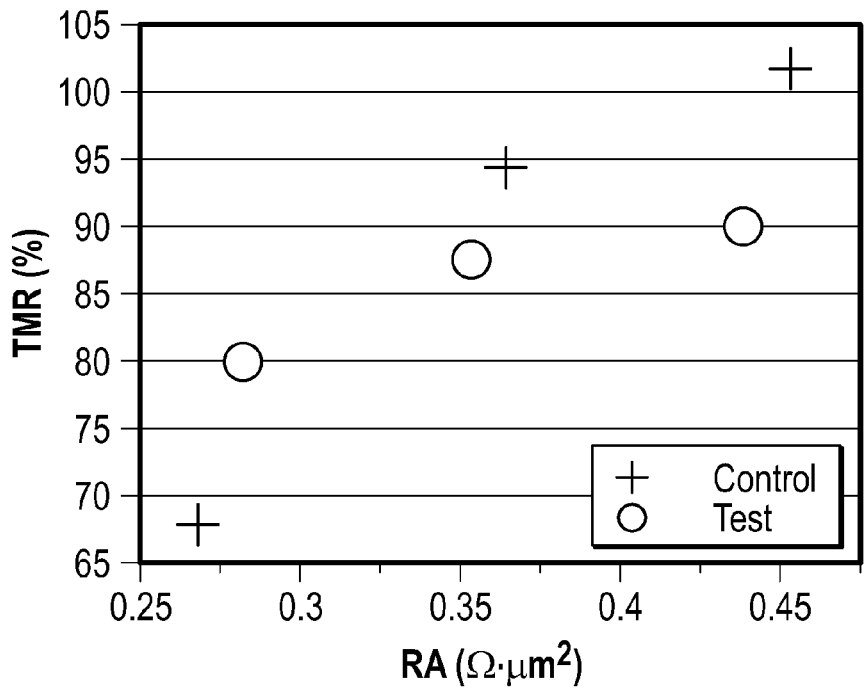
FIG. 5 is a graph of TMR as a function of resistance-area product (RA) for test devices according to an embodiment of the invention and for control devices.

FIG. 5 shows the measured values of TMR. As RA is decreased from about 0.45 Ω·μm² to about 0.27 Ω·μm² the TMR for the control devices decreases more rapidly than the TMR for the test devices, and at low values of RA the test devices exhibit higher TMR. This is believed due to a reduction in the migration of the boron into the MgO layer and/or by replacement of boron atoms in the MgO with nitrogen atoms during annealing.

Figure 6:
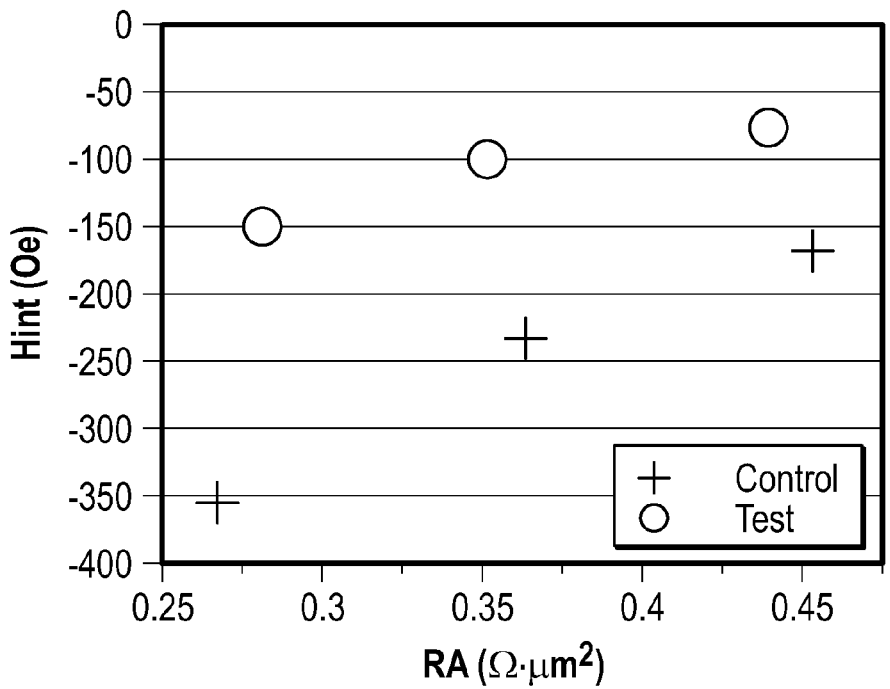
FIG. 6 is a graph of interlayer coupling filed ($H_{int}$) as a function of RA for test devices according to an embodiment of the invention and for control devices.

FIG. 6 shows the measured values of $H_{int}$. For all values of RA, the test devices showed substantially lower absolute values of $H_{int}$ than the control devices. In addition, the magnetic properties of the test devices, such as coercivity and magnetostriction, were not significantly different than the control devices, thereby ensuring adequate stability in the read head.

While the present invention has been particularly shown and described with reference to the preferred embodiments, it will be understood by those skilled in the art that various changes in form and detail may be made without departing from the spirit and scope of the invention. Accordingly, the disclosed invention is to be considered merely as illustrative and limited in scope only as specified in the appended claims.

What is claimed is:

1. A tunneling magnetoresistive (TMR) device comprising:
   a substrate;
   a first ferromagnetic layer on the substrate;
   a tunneling barrier layer consisting essentially of MgO on the first ferromagnetic layer; and
   a second ferromagnetic layer on the tunneling barrier layer;
   wherein one of said first and second ferromagnetic layers is a free ferromagnetic multilayer having an in-plane magnetization direction substantially free to rotate in the presence of an external magnetic field, the free ferromagnetic multilayer comprising a boron-containing layer and a nitrogen-containing layer between the barrier layer and the boron-containing layer; and wherein the other of said first and second ferromagnetic layers is a reference ferromagnetic layer having an in-plane magnetization direction substantially prevented from rotation in the presence of an external magnetic field.

2. The device of claim 1 wherein said free ferromagnetic multilayer further comprises a first nanolayer in contact with the barrier layer and selected from Co, Fe and an alloy consisting of Co and Fe, and wherein said nitrogen-containing layer is a second nanolayer in contact with the first nanolayer and selected from a FeN alloy and a CoFeN alloy.

3. The device of claim 2 wherein the first and second nanolayers have a combined thickness greater than or equal to 2 Å and less than or equal to 8 Å.

4. The device of claim 2 wherein said FeN alloy has a composition of the form $Fe_{(100-x)}N_x$, where x is between 1 and 50 atomic percent, and wherein said CoFeN alloy has a composition of the form $(Co_xFe_{(100-x)})_{(100-y)}N_y$, where x is between 20 and 80 atomic percent and y is between 1 and 50 atomic percent.

5. The device of claim 2 wherein said free ferromagnetic multilayer further comprises a third nanolayer in contact with the second nanolayer and selected from Co, Fe and an alloy consisting of Co and Fe.

6. The device of claim 1 wherein said boron-containing layer is an alloy comprising Co, Fe and B.

7. The device of claim 6 wherein said boron-containing layer is an alloy further comprising Ta.

8. The device of claim 1 wherein said free ferromagnetic multilayer is the first ferromagnetic layer, and said reference ferromagnetic layer is the second ferromagnetic layer.

9. The device of claim 1 wherein said reference ferromagnetic layer is the first ferromagnetic layer, and said free ferromagnetic multilayer is the second ferromagnetic layer.

10. The device of claim 1 wherein said reference ferromagnetic layer is part of an antiparallel (AP) pinned structure comprising a first AP-pinned (AP1) ferromagnetic layer having an in-plane magnetization direction, a second AP-pinned (AP2) ferromagnetic layer adjacent the tunneling barrier layer and having an in-plane magnetization direction substantially antiparallel to the magnetization direction of the AP1 layer, and an AP coupling (APC) layer between and in contact with the AP1 and AP2 layers, wherein the reference layer is the AP2 layer.

11. The device of claim 1 wherein said reference ferromagnetic layer is a reference ferromagnetic multilayer comprising a boron-containing layer and a nitrogen-containing layer between the barrier layer and the boron-containing layer.

12. A tunneling magnetoresistive (TMR) read head comprising:

a first shield layer of magnetically permeable material;

a reference ferromagnetic layer on the first shield layer and having an in-plane magnetization direction substantially prevented from rotation in the presence of an external magnetic field;

an electrically insulating tunneling barrier layer consisting essentially of MgO on and in contact with the reference layer;

a free ferromagnetic layer on the tunneling barrier layer and having an in-plane magnetization direction oriented substantially orthogonal to the magnetization direction of the reference layer in the absence of an external magnetic field, the free ferromagnetic layer comprising a first nanolayer in contact with the barrier layer and selected from Co, Fe and an alloy consisting of Co and Fe, a second nanolayer in contact with the first nanolayer and selected from a FeN alloy and a CoFeN alloy, and a boron-containing ferromagnetic layer on the second nanolayer;

a capping layer on the free ferromagnetic layer; and a second shield layer of magnetically permeable material on the capping layer.

13. The read head of claim 12 wherein said FeN alloy has a composition of the form $Fe_{(100-x)}N_x$, where x is between 1 and 50 atomic percent, and said CoFeN alloy has a composition of the form $(Co_xFe_{(100-x)})_{(100-y)}N_y$, where x is between 20 and 80 atomic percent and y is between 1 and 50 atomic percent.

14. The read head of claim 12 further comprising a third nanolayer in contact with the second nanolayer and selected from Co, Fe and an alloy consisting of Co and Fe, and wherein said boron-containing layer is in contact with the third nanolayer.

15. The read head of claim 14 wherein the combined thicknesses of the first, second and third nanolayers is greater than or equal to 3 Å and less than or equal to 12 Å.

16. The read head of claim 12 wherein said reference layer comprises a boron-containing ferromagnetic layer, a first nanolayer in contact with the barrier layer and selected from Co, Fe and an alloy consisting of Co and Fe, and a second nanolayer between the boron-containing layer and the first nanolayer and selected from a FeN alloy and a CoFeN alloy.

17. The read head of claim 12 further comprising an antiparallel (AP) pinned structure between the first shield layer and the barrier layer and comprising a first AP-pinned (AP1) ferromagnetic layer on the first shield layer and having an in-plane magnetization direction, a second AP-pinned (AP2) ferromagnetic layer having an in-plane magnetization direction substantially antiparallel to the magnetization direction of the AP1, and an AP coupling (APC) layer between and in contact with the AP1 and AP2 layers, and wherein said reference layer is said AP2 layer.

* * * * *